US012581882B2

(12) United States Patent
Ohashi

(10) Patent No.: US 12,581,882 B2
(45) Date of Patent: Mar. 17, 2026

(54) SUBSTRATE PROCESSING METHOD, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventor: Naofumi Ohashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 512 days.

(21) Appl. No.: 17/897,275

(22) Filed: Aug. 29, 2022

(65) Prior Publication Data

US 2023/0068877 A1 Mar. 2, 2023

(30) Foreign Application Priority Data

Aug. 30, 2021 (JP) ................................. 2021-140210

(51) Int. Cl.
*H01L 21/311* (2006.01)
*H01L 21/3065* (2006.01)
*H01J 37/32* (2006.01)

(52) U.S. Cl.
CPC .... *H01L 21/31116* (2013.01); *H01L 21/3065* (2013.01); *H01L 21/30655* (2013.01); *H01J 37/32449* (2013.01); *H01J 2237/3344* (2013.01); *H01J 2237/3345* (2013.01); *H01L 21/31144* (2013.01)

(58) Field of Classification Search
CPC .......... H01L 21/00–86; H01J 37/32449; H01J 2237/3344–3345
See application file for complete search history.

(56) References Cited

U.S. PATENT DOCUMENTS

| | | | |
|---|---|---|---|
| 2012/0171869 A1 | 7/2012 | Morikawa et al. | |
| 2014/0017898 A1 | 1/2014 | Nemani | |
| 2017/0229314 A1* | 8/2017 | Tan ........................ | H01J 37/321 |
| 2017/0365487 A1* | 12/2017 | Shen ........................ | C23C 16/56 |
| 2018/0315615 A1* | 11/2018 | Rastogi ............. | H01L 21/31122 |

FOREIGN PATENT DOCUMENTS

| | | |
|---|---|---|
| JP | 2002-141336 A | 5/2002 |
| JP | 2015-523734 A | 8/2015 |
| JP | 2017-157660 A | 9/2017 |

OTHER PUBLICATIONS

Extended European Search Report issued on Jan. 17, 2023 for European Patent Application No. 22192271.9.
Korean Office Action issued on Dec. 26, 2023 for Korean Patent Application No. 10-2022-0107485.

* cited by examiner

*Primary Examiner* — Joshua L Allen
*Assistant Examiner* — Andrew Keelan Laobak
(74) *Attorney, Agent, or Firm* — Volpe Koenig

(57) ABSTRACT

There is provided a technique that includes forming a modified film by supplying a modifying gas to modify an unmasked deposited film on a substrate; and removing the modified film, including supplying a removal gas activated by plasma and supplying a protective-film-forming gas at least at the same time.

16 Claims, 10 Drawing Sheets

FIG. 1

FIG. 3A
Initial state
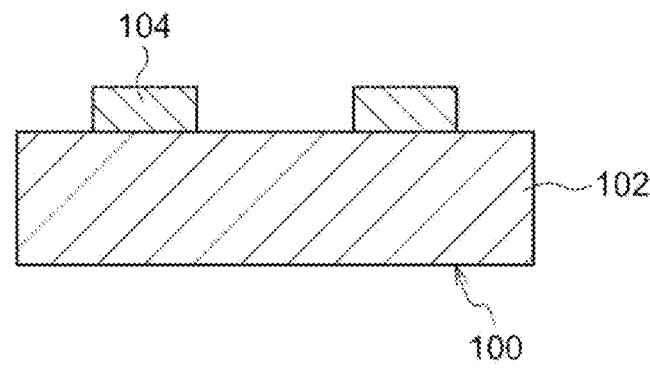
FIG. 3B
Modifying step
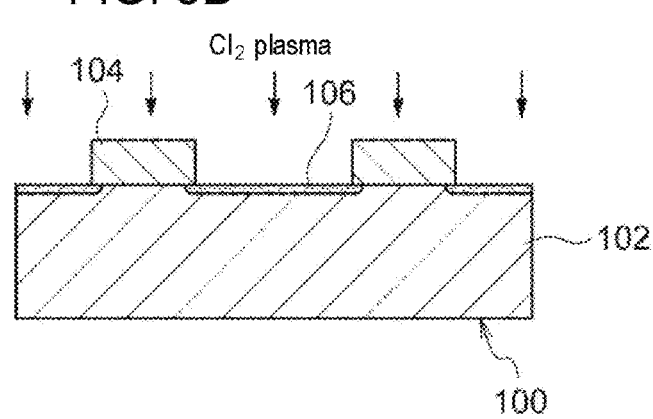
FIG. 3C
Modified-film-removing-step Repeating step (Repeating "modifying step" and
"modified-film-removing step")

SUBSTRATE PROCESSING METHOD, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2021-140210, filed on Aug. 30, 2021, the entire contents of which are incorporated herein by reference.

TECHNICAL FIELD

The present disclosure relates to a substrate processing method, a method of manufacturing a semiconductor device, a substrate processing apparatus, and a recording medium.

BACKGROUND

In recent years, there has been a technique for etching a target film by masking the target film with a predetermined pattern.

As one of the etching techniques, an atomic layer etching (ALE) technique for etching in the unit of atomic layer of the outermost surface of the target film has been proposed.

In such a technique, a first gas (for example, $Cl_2$ or the like) or the like containing halogen is adsorbed on a layer (for example, a layer containing Si) on a substrate, and then the layer on the substrate is etched by using a neutral metastable gas (for example, plasma of Ar or the like).

Here, when the layer on the substrate is removed, the plasma directivity due to the neutral metastable gas may influence the etching to proceed in a vertical direction, so that the removal of a layer on a side wall surface below a mask may be reduced. Such an etching state is called anisotropic etching.

In this way, if there is a difference between the vertical and horizontal etching rates, a semiconductor manufacturing process to be applied may be limited, and there is a desire to reduce the difference between the vertical and horizontal etching rates. Such a state in which the difference between the vertical and horizontal etching rates is small is called isotropic etching.

SUMMARY

Some embodiments of the present disclosure provide a technique capable of realizing isotropic etching by reducing the influence of plasma directivity.

According to one embodiment of the present disclosure, there is provided a technique that includes forming a modified film by supplying a modifying gas to modify an unmasked deposited film on a substrate; and removing the modified film, including supplying a removal gas activated by plasma and supplying a protective-film-forming gas at least at the same time.

BRIEF DESCRIPTION OF DRAWINGS

The accompanying drawings, which are incorporated in and constitute a part of the specification, illustrate embodiments of the present disclosure.

FIG. 1 is an explanatory view showing a schematic configuration example of a substrate processing apparatus according to a first embodiment of the present disclosure.

FIG. 3A is an explanatory view showing an initial state of a substrate in a substrate processing process according to the first embodiment of the present disclosure.

FIG. 3B is an explanatory view showing a substrate surface modifying step.

FIG. 3C is an explanatory view showing a substrate modified-film-removing step.

DETAILED DESCRIPTION

Figure 2:
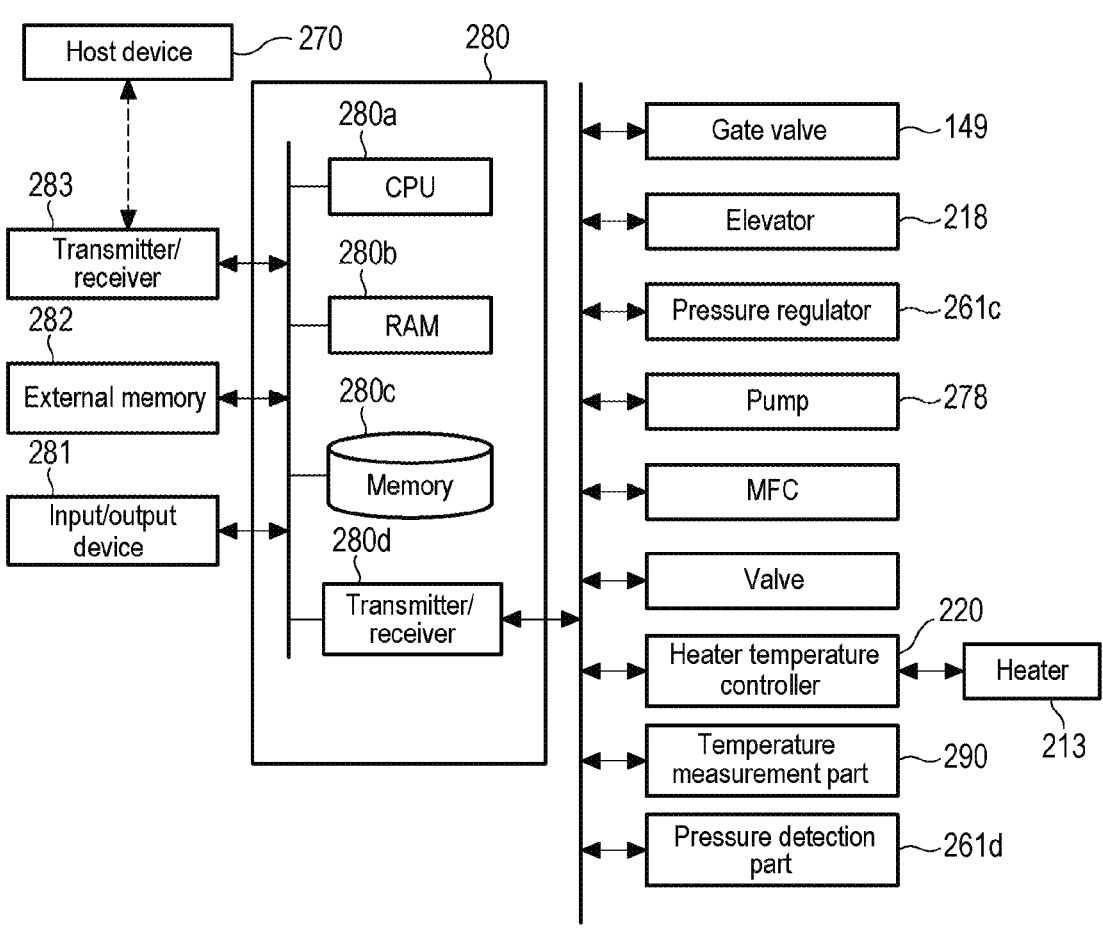
FIG. 2 is an explanatory diagram for explaining a controller of the substrate processing apparatus according to the first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings. However, in the following description, the same constituent elements may be denoted by the same reference numerals, and explanation thereof may not be repeated. The drawings may be represented schematically as compared with actual aspects in order to clarify the explanation, but the drawings are merely examples and do not limit the interpretation of the present disclosure. Further, the dimensional relationship, ratios, and the like of various elements shown in figures do not always match the actual ones. Further, the dimensional relationship, ratios, and the like of various elements between plural figures do not always match each other.

First Embodiment of the Present Disclosure

Figure 1:
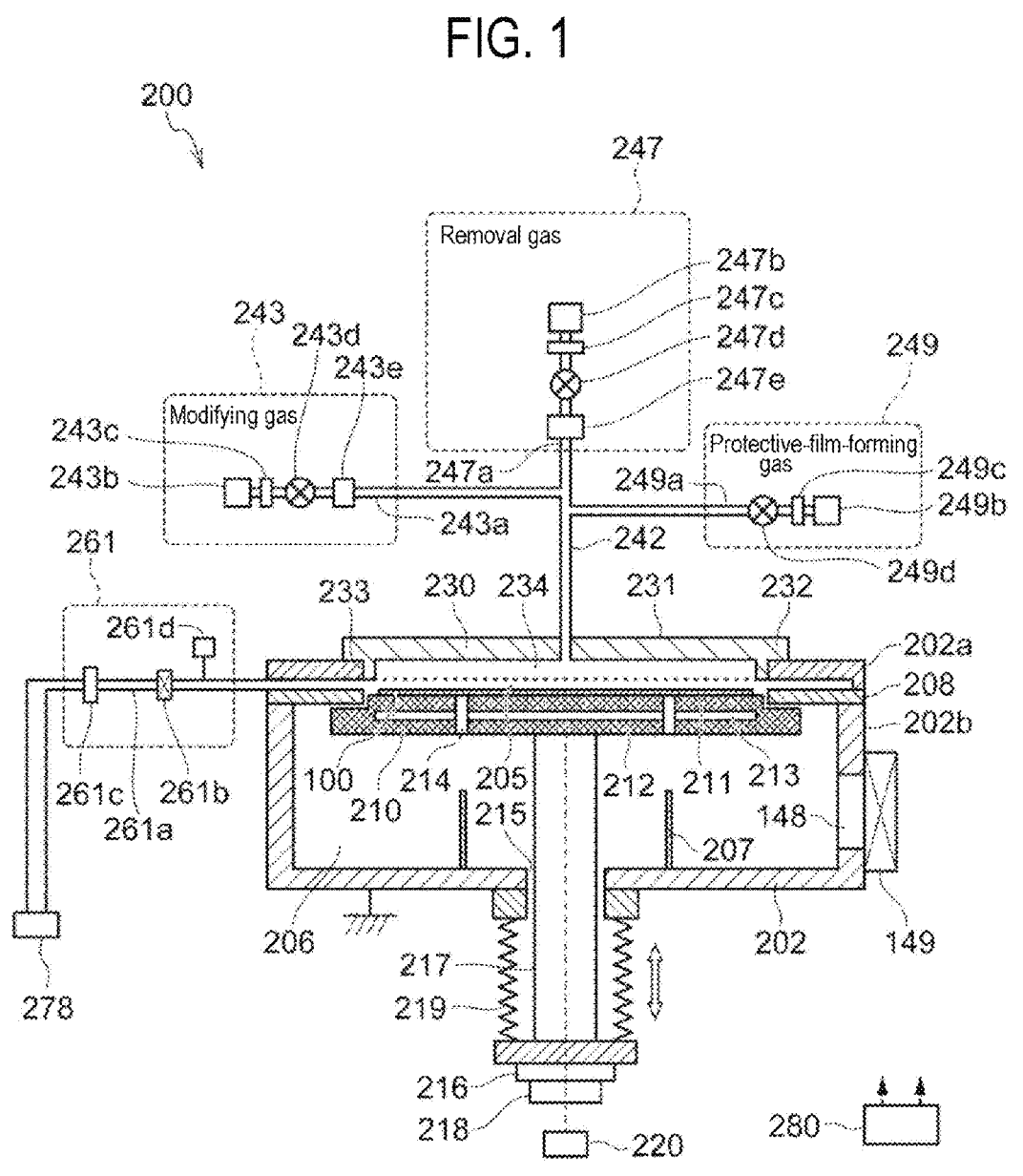

A substrate processing apparatus and a method of manufacturing a semiconductor device according to a first embodiment of the present disclosure will be described with reference to FIGS. 1 to 7.

(1) Configuration of Substrate Processing Apparatus

FIG. 1 is an explanatory view for explaining the substrate processing apparatus according to the first embodiment. Each configuration will be specifically described below.

(Chamber)

As shown in FIG. 1, the substrate processing apparatus 200 includes a chamber 202 as a processing container. The chamber 202 is an example of the processing container. The chamber 202 is configured as, for example, a flat closed container having a circular cross section. Further, the chamber 202 is made of a metal material such as aluminum (Al) or stainless steel (SUS). A processing space 205 for processing a substrate 100 such as a silicon substrate as a substrate and a transfer space 206 through which the substrate 100 passes when the substrate 100 is transferred to the processing space 205 are formed in the chamber 202. The chamber 202 is composed of an upper container 202a and a lower container 202b. A partition plate 208 is installed between the upper container 202a and the lower container 202b.

A substrate loading/unloading port 148 adjacent to a gate valve 149 is installed on a side surface of the lower container 202b, and the substrate 100 moves from/to a vacuum transfer chamber (not shown) via the substrate loading/unloading port 148. A plurality of lift pins 207 are installed at the bottom of the lower container 202b. Further, the lower container 202b is grounded.

A process chamber constituting the processing space 205 is composed of, for example, a substrate mounting table 212 and a shower head 230, which will be described later. That is, the processing space 205 is provided between the substrate mounting table 212 and the shower head 230, which are supported by the upper container 202a. Here, the processing space 205 in the chamber 202 is an example of the process chamber. A substrate mounting part 210 on which the substrate 100 is mounted is installed in the processing space 205. The substrate mounting part 210 mainly includes a substrate mounting surface 211 on which the substrate 100 is mounted, the substrate mounting table 212 having the substrate mounting surface 211 on the surface of the substrate mounting table 212, and a heater 213 as a heating source contained in the substrate mounting table 212. The substrate mounting table 212 is provided with through-holes 214 through which the lift pins 207 penetrates at positions corresponding to the lift pins 207. A heater temperature controller 220 that controls the temperature of the heater 213 is connected to the heater 213.

The substrate mounting table 212 is supported by a shaft 217. A support part of the shaft 217 penetrates a hole 215 provided in a bottom wall of the chamber 202 and is further connected to an elevator 218 outside the chamber 202 via a support plate 216. By operating the elevator 218 to raise or lower the shaft 217 and the substrate mounting table 212, it is possible to raise or lower the substrate 100 mounted on the substrate mounting surface 211. The circumference of a lower end portion of the shaft 217 is covered with a bellows 219. The interior of the chamber 202 is kept airtight.

When the substrate 100 is transferred, the substrate mounting table 212 lowers to a position where the substrate mounting surface 211 faces the substrate loading/unloading port 148, and when the substrate 100 is processed, the substrate mounting table 212 rises until the substrate 100 reaches a processing position in the processing space 205, as shown in FIG. 1.

Specifically, when the substrate mounting table 212 is lowered to a substrate transfer position, the upper end portions of the lift pins 207 protrude from an upper surface of the substrate mounting surface 211 and the lift pins 207 support the substrate 100 from below. Further, when the substrate mounting table 212 is raised to a substrate processing position, the lift pins 207 are buried from the upper surface of the substrate mounting surface 211 and the substrate mounting surface 211 supports the substrate 100 from below.

The shower head 230 is installed in the upper portion (upstream side) of the processing space 205. The shower head 230 includes a lid 231. The lid 231 includes a flange 232 supported on the upper container 202a. Further, the lid 231 includes a positioning part 233. The lid 231 is fixed by fitting the positioning part 233 to the upper container 202a.

The shower head 230 includes a buffer space 234. The buffer space 234 refers to a space composed of the lid 231 and the positioning part 233. The buffer space 234 and the processing space 205 communicate with each other. A gas supplied to the buffer space 234 diffuses in the buffer space 234 and is uniformly supplied to the processing space 205. Here, the buffer space 234 and the processing space 205 are described as having different configurations, but the present disclosure is not limited thereto, and the buffer space 234 may be included in the processing space 205.

The processing space 205 is mainly composed of the upper container 202a and an upper structure of the substrate mounting table 212 in the substrate processing position. A structure constituting the processing space 205 is called a process chamber. The process chamber may have a structure constituting the processing space 205 and is not limited to the above structure.

The transfer space 206 is mainly composed of the lower container 202b and a lower structure of the substrate mounting table 212 in the substrate processing position. A structure constituting the transfer space 206 is called a transfer chamber. The transfer chamber is located below the process chamber. The transfer chamber may have a structure constituting the transfer space 206 and is not limited to the above structure.

(Gas Supplier)

Subsequently, a gas supplier will be described. A first gas supply pipe 243a, a second gas supply pipe 247a, and a third gas supply pipe 249a are connected to a common gas supply pipe 242.

A first processing gas is mainly supplied from a first gas supply system 243 including the first gas supply pipe 243a, a second processing gas is mainly supplied from a second gas supply system 247 including the second gas supply pipe 247a, and a third gas is mainly supplied from a third gas supply system 249 including the third gas supply pipe 249a.

(First Gas Supply System)

A first gas supply source 243b, a mass flow controller (MFC) 243c, which is a flow rate controller (flow control part), and a valve 243d, which is an opening/closing valve, are installed sequentially from an upstream side at the upstream of the first gas supply pipe 243a. In the first embodiment, the first processing gas is a modifying gas. In order to bring the modifying gas into a plasma state, a remote plasma unit (RPU) 243e as a plasma generation part is installed at the downstream of the valve 243d in the first gas supply pipe 243a.

Then, the modifying gas is supplied from the first gas supply pipe 243a into the shower head 230 via the MFC 243c, the valve 243d, and the common gas supply pipe 242. The modifying gas is brought into the plasma state by the RPU 243e.

As the modifying gas, for example, a gas containing halogen such as chlorine (Cl) is used. As the modifying gas, for example, a $Cl_2$ gas brought in a plasma state is supplied from the first gas supply system 243. In addition, instead of the $Cl_2$ gas, for example, a HF gas brought in a plasma state may be supplied.

The first gas supply system 243 mainly includes the first gas supply pipe 243a, the first gas supply source 243b, the MFC 243c, the valve 243d, and the RPU 243e. The first gas supply system 243 is an example of a modifying gas supplier.

As will be described later, by supplying the modifying gas, a deposited film 102 not masked by a pattern 104 on the substrate 100 (unmasked deposited film) is modified to form a modified film 106 (see FIG. 3B). For example, the modified film 106 is a modified layer formed in a layer on the surface of the deposited film 102.

(Second Gas Supply System)

A second gas supply source 247b, a mass flow controller (MFC) 247c, which is a flow rate controller (flow control part), a valve 247d, which is an opening/closing valve, and a remote plasma unit (RPU) 247e as a plasma generation part are installed sequentially from an upstream side in the second gas supply pipe 247a.

The second processing gas is supplied from the second gas supply pipe 247a into the shower head 230 via the MFC 247c, the valve 247d, and the common gas supply pipe 242. The second processing gas is brought into a plasma state by the RPU 247e.

In the first embodiment, the second processing gas is a removal gas. The removal gas is a gas activated by plasma and is a gas that etches (removes) the modified film 106 on the substrate 100. For example, by modifying the deposited film 102 on the substrate 100 to obtain the modified film 106, the modified film 106 is easily etched. As the removal gas, for example, an argon (Ar) gas brought in a plasma state is supplied from the second gas supply system 247. In addition, instead of the Ar gas, for example, DMAC ($AlCl(CH_3)_2$) brought in a plasma state may be supplied.

The second gas supply system 247 mainly includes the second gas supply pipe 247a, the second gas supply source 247b, the mass flow controller 247c, and the valve 247d. The second gas supply system 247 is an example of a removal gas supplier.

In the substrate processing apparatus 200 of the first embodiment, after a step of supplying the modifying gas from the first gas supply system 243 is completed (that is, after the supply of the modifying gas is stopped), the removal gas activated by plasma is supplied from the second gas supply system 247.

(Third Gas Supply System)

A third gas supply source 249b, a mass flow controller (MFC) 249c, which is a flow rate controller (flow control part), and a valve 249d, which is an opening/closing valve, are installed sequentially from an upstream side in the third gas supply pipe 249a.

The third gas is supplied from the third gas supply pipe 249a into the shower head 230 via the MFC 249c, the valve 249d, and the common gas supply pipe 242. In the first embodiment, the third gas is a protective-film-forming gas. The protective-film-forming gas has a property of being able to adhere to the surface of the modified film. The protective-film-forming gas is adsorbed on the surface of the modified film 106 on the substrate 100 to form a protective film on the surface of the modified film 106. By forming the protective film on the surface of the modified film 106, the modified film 106 on the substrate 100 is less likely to be etched by the removal gas. As the protective-film-forming gas, for example, a CH-based (for example, $C_3H_6$ or the like) gas is supplied from the third gas supply system 249.

The third gas supply system 249 mainly includes the third gas supply pipe 249a, the third gas supply source 249b, the mass flow controller 249c, and the valve 249d. The third gas supply system 249 is an example of a protective-film-forming gas supplier.

The substrate processing apparatus 200 is configured to supply the removal gas activated by the plasma from the second gas supply system 247 and the protective-film-forming gas from the third gas supply system 249 at a timing at which these gases are supplied at least at the same time. The timing of supplying the removal gas activated by the plasma and the protective-film-forming gas will be described later.

(Exhauster)

An exhauster that exhausts the atmosphere of the chamber 202 is mainly composed of an exhauster 261 that exhausts the atmosphere of the processing space 205.

The exhauster 261 has an exhaust pipe 261a connected to the processing space 205. The exhaust pipe 261a is provided so as to communicate with the processing space 205. The exhaust pipe 261a is provided with an APC (Auto Pressure Controller) 261c, which is a pressure regulator that controls or adjusts the interior of the processing space 205 to a predetermined pressure, and a first pressure detection part (i.e., a first pressure detector) 261d that measures the pressure of the processing space 205. The APC 261c has a valve body (not shown) whose opening degree can be adjusted, and adjusts the conductance of the exhaust pipe 261a according to an instruction from a controller 280 to be described later. Further, a valve 261b is installed on the upstream side of the APC 261c in the exhaust pipe 261a. The exhaust pipe 261a, the valve 261b, the APC 261c, and the pressure detection part 261d are collectively referred to as the exhauster 261.

A pump 278 is installed on the downstream side of the exhaust pipe 261a. As the pump 278, for example, a vacuum pump, a DP (Dry Pump) or the like is used. The pump 278 exhausts the atmosphere of the processing space 205 through the exhaust pipe 261a.

(Controller)

The substrate processing apparatus 200 includes a controller 280 that is configured to be capable of controlling the operation of each part of the substrate processing apparatus 200. As shown in FIG. 2, the controller 280 has at least an operation (CPU) 280a, a temporary memory (RAM) 280b, a memory 280c, and a transmitter/receiver 280d. The controller 280 is connected to each configuration of the substrate processing apparatus 200 via the transmitter/receiver 280d, calls a program or recipe from the memory 280c according to an instruction from a host controller or a user, and controls the operation of each configuration according to the contents thereof.

More specifically, the controller 280 is connected to the gate valve 149, the elevator 218, the pressure regulator 261*c*, and the pump 278 of the substrate processing apparatus 200 via the transmitter/receiver 280*d*. Further, the controller 280 is connected to the MFC 243*c*, the MFC 247*c*, the MFC 249*c*, the valve 243*d*, the valve 247*d*, the valve 249*d*, the pressure detection part 261*d*, etc. of the substrate processing apparatus 200 via the transmitter/receiver 280*d*. Further, the controller 280 is connected to the heater temperature controller 220 that controls the temperature of the heater 213, a temperature measurement part 290 that measures a temperature in the vicinity of the heater 213, and the like via the transmitter/receiver 280*d*.

Further, the controller 280 may be configured as a dedicated computer or a general-purpose computer. For example, the controller 280 according to the present embodiment can be configured by preparing an external memory 282 storing the above-mentioned program and installing the program on the general-purpose computer by using the external memory 282. Examples of the external memory 282 may include a magnetic tape, a magnetic disk such as a flexible disk or a hard disk, an optical disc such as a CD or a DVD, a magneto-optical disc such as an MO, a semiconductor memory such as an USB memory (USB Flash Drive) or a memory card, and the like. Further, a means for supplying the program to the computer is not limited to the case of supplying the program via the external memory 282. For example, a communication means such as the Internet or a dedicated line may be used, or information may be received from a host device 270 via the transmitter/receiver 283 and the program may be supplied without going through the external memory 282. Further, an input/output device 281 such as a key board or a touch panel may be used to give an instruction to the controller 280.

The memory 280*c* and the external memory 282 are configured as a computer-readable recording medium. Hereinafter, these are collectively referred to simply as a recording medium. When the term "recording medium" is used in the present disclosure, it may include the memory 280*c* only, the external memory 282 alone, or both of them.

(2) Method of Manufacturing Semiconductor Device

Next, a method of manufacturing the semiconductor device will be described. In the method of manufacturing the semiconductor device, each step of a substrate processing process to be described later is performed. In the substrate processing process, the substrate processing apparatus 200 shown in FIG. 1 is used. A specific example will be described below. In the following description, the operation of each part constituting the substrate processing apparatus 200 is controlled by the controller 280.

(Substrate Loading/Mounting Step)

The substrate mounting table 212 is lowered to the transfer position of the substrate 100, and the lift pins 207 are penetrated through the through-holes 214 of the substrate mounting table 212. As a result, the lift pins 207 is in a state of protruding from the surface of the substrate mounting table 212 by a predetermined height. In parallel with this operation, the atmosphere of the transfer space 206 is exhausted and the pressure of the transfer space 206 becomes the same as or lower than that of the adjacent vacuum transfer chamber (not shown). Here, the substrate 100 (see FIG. 3A) in which the deposited film 102 and the pattern 104 that masks a portion of the surface of the deposited film 102 are formed on the upper side of the substrate 100 is loaded. A layer such as the deposited film 102 formed on the substrate 100 will be described later.

Subsequently, the gate valve 149 is opened to allow the transfer space 206 to communicate with the adjacent vacuum transfer chamber. Then, the substrate 100 is loaded into the transfer space 206 from this vacuum transfer chamber by using a vacuum transfer robot (not shown).

(Substrate Processing Position Moving Step)

After the lapse of a predetermined time, the substrate mounting table 212 is raised, the substrate 100 is mounted on the substrate mounting surface 211, and the substrate mounting table 212 is further raised to the substrate processing position, as shown in FIG. 1. In the substrate processing position, each step of the substrate processing process is performed on the substrate 100 mounted on the substrate mounting surface 211.

(Outline of Substrate Processing Process)

FIGS. 3A to 3D are explanatory views showing the substrate processing process. FIG. 4 is a flow chart for explaining timings at which the modifying gas, the removal gas, and the protective-film-forming gas are supplied in the substrate processing process. As shown in FIGS. 3A to 3D, the substrate processing process includes a modifying step, a modified-film-removing step, and a repeating step of repeatedly performing the modifying step and the modified-film-removing step.

Figures 3D, 4:
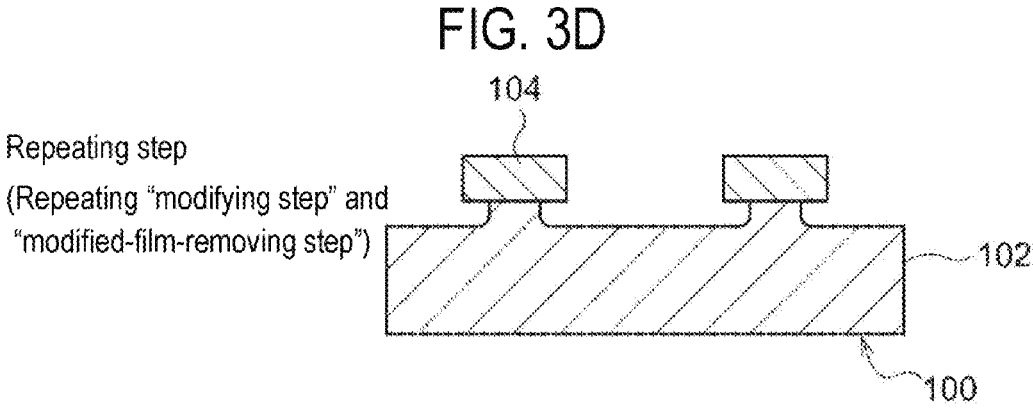
FIG. 3D is an explanatory view showing a substrate processing repeating step.
FIG. 4 is a flow chart for explaining the substrate processing process according to the first embodiment of the present disclosure.

FIG. 3A shows an initial state of the substrate 100 to be processed. As shown in FIG. 3A, the deposited film 102 as a target film to be processed is formed on the substrate 100. The pattern 104 that masks a portion of the deposited film 102 is formed on the surface of the deposited film 102. The pattern 104 is not subject to processing. As the deposited film 102, for example, a Si film is used. Further, as the deposited film 102, for example, a film made of $Al_2O_3$ may be used instead of the Si film. In FIG. 3A, in order to make the configuration of the substrate 100 easy to be understood, the deposited film 102 and the pattern 104 formed on the upper side of the substrate 100 are shown, and the other layers on the substrate 100 are not shown. In FIGS. 3B to 3D and 6 and the like, a processing state in the vicinity of the deposited film 102 formed on the upper side of the substrate 100 is shown, and the other layers on the substrate 100 are not shown.

(Modifying Step)

FIG. 3B shows the modifying step. As shown in FIG. 3B, in the modifying step, the modifying gas is supplied to the processing space 205 (see FIG. 1) in which the substrate 100 is arranged (see FIG. 4). As a result, the deposited film 102 not masked by the pattern 104 on the substrate 100 is modified by the modifying gas and the modified film 106 is formed. For example, when a Si film is used as the deposited film 102, $Cl_2$ or the like in a plasma state is used as the modifying gas. As a result, for example, the modified film 106 containing $SiCl_2$ and the like is formed on the surface of the deposited film 102 on the substrate 100. Further, instead of the above-mentioned material, for example, when a film made of $Al_2O_3$ is used as the deposited film 102, HF gas in a plasma state may be used as the modifying gas.

In the substrate processing apparatus 200 of the first embodiment, the modifying gas in the plasma state is supplied from the first gas supply system 243 (see FIG. 1). The modifying gas is altered into the plasma state by the RPU 243*e*.

(Modified-Film-Removing Step)

FIG. 3C shows the modified-film-removing step. As shown in FIG. 3C, in the modified-film-removing step, the removal gas activated by plasma is supplied to the processing space 205 (see FIG. 1) in which the substrate 100 is arranged. The modified-film-removing step includes the timing of supplying the removal gas activated by plasma and the protective-film-forming gas at least at the same time. As shown in FIG. 4, in the first embodiment, the supply of the plasma-activated removal gas and the protective-film-forming gas is started at the same time, and the supply of the plasma-activated removal gas and the protective-film-forming gas is stopped at the same time. As a result, the modified film 106 on the substrate 100 is removed. In the modified-film-removing step, the supply of the protective-film-forming gas generates a saturated state of etching in a pseudo manner and a side etching of the modified film 106 on the substrate 100 proceeds. The details of the modified-film-removing step in which the modified film 106 on the substrate 100 is removed will be described later.

For example, when the Si film is used as the deposited film 102 and $Cl_2$ in the plasma state is used as the modifying gas, argon (Ar) in a plasma state is used as the removal gas. Further, $C_3H_6$ or the like is used as the protective-film-forming gas. Further, instead of the above-mentioned material, when the film made of $Al_2O_3$ is used as the deposited film 102 and the HF gas in the plasma state is used as the modifying gas, DMAC ($AlCl(CH_3)_2$) or the like in the plasma state may be used as the removal gas and $C_3H_6$ or the like may be used as the protective-film-forming gas.

In the substrate processing apparatus 200 of the first embodiment, the removal gas in the plasma state is supplied from the second gas supply system 247 at a timing shown in FIG. 4 (see FIG. 1). The removal gas is altered into the plasma state by the RPU 247e. Further, in the substrate processing apparatus 200, the protective-film-forming gas is supplied from the third gas supply system 249 at a timing shown in FIG. 4 (see FIG. 1).

(Repeating Step)

FIG. 3D shows the repeating step in which the modifying step and the modified-film-removing step are repeatedly performed a predetermined number of times. As shown in FIG. 3D, in the repeating step, the modifying step and the modified-film-removing step are regarded as one cycle, and the one cycle is repeated. In the repeating step of the first embodiment, the one cycle is repeated at least once (see FIG. 4). As a result, in the first embodiment, the one cycle is performed twice or more. In the first embodiment, the modified film 106 on the substrate 100 is removed in the two modified-film-removing steps, so that a desired film thickness of the deposited film 102 on the substrate 100 is removed. That is, a desired etching amount of the modified film 106 on the substrate 100 is secured by the repeating step in which the one cycle is repeated, as compared with a case where the etching time is lengthened in one modified-film-removing step. The number of cycles is set according to a required etching amount.

In the substrate processing apparatus 200 of the first embodiment, in the modifying step of the repeating step, the modifying gas in the plasma state is supplied from the first gas supply system 243 (see FIG. 1). Further, in the substrate processing apparatus 200, in the modified-film-removing step of the repeating step, the removal gas in the plasma state is supplied from the second gas supply system 247 and the protective-film-forming gas is supplied from the third gas supply system 249.

(Influence of Supply of Removal Gas and Protective-Film-Forming Gas)

Here, in the modified-film-removing step, the influence of the supply of the removal gas activated by the plasma and the protective-film-forming gas will be described.

Figures 5, 6:
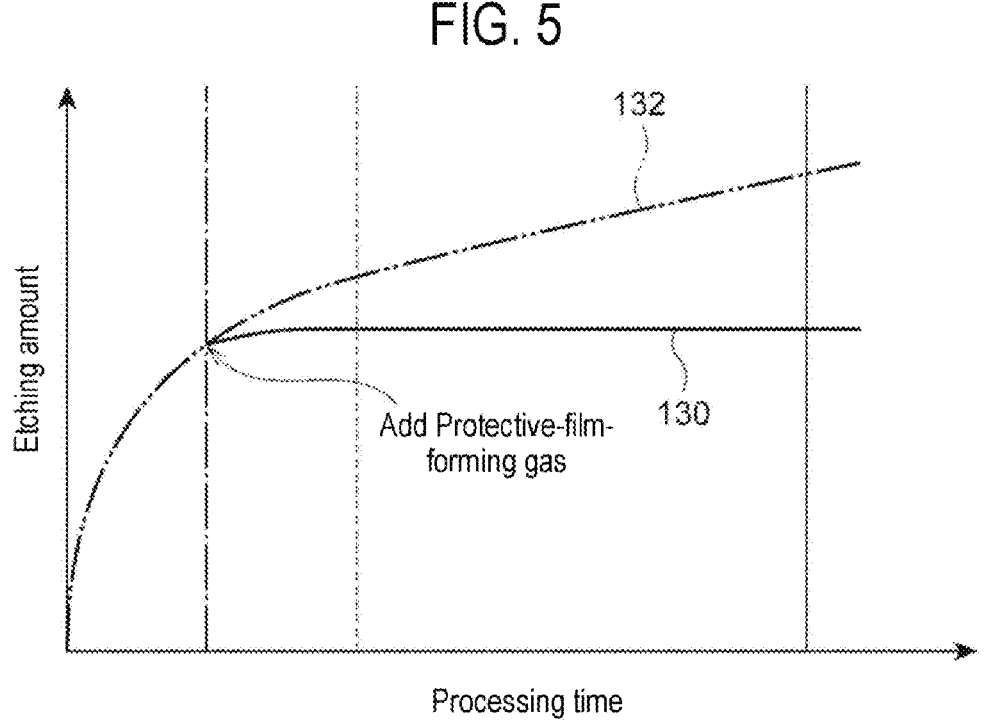
FIG. 5 is a graph showing the relationship between a processing time and the etching amount in the substrate processing process.
FIG. 6 is an explanatory view for explaining an etching process in the substrate processing process according to the first embodiment of the present disclosure.

FIG. 5 shows the relationship between a processing time and the etching amount. A solid line graph 130 shown in FIG. 5 is an example of the present technique including a process of supplying the plasma-activated removal gas and the protective-film-forming gas. Further, a two-dot chain line graph 132 shown in FIG. 5 is a comparative example including a process of supplying only the plasma-activated removal gas. As shown in FIG. 5, in the graph 132 of the comparative example, the etching amount increases with the processing time by supplying only the plasma-activated removal gas.

Figure 12:
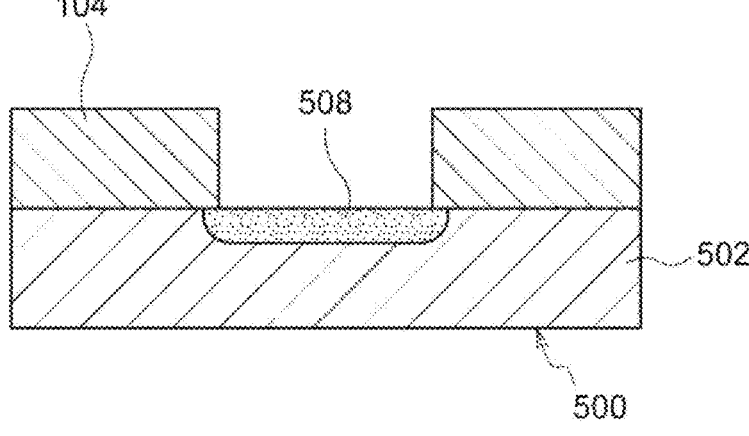
FIG. 12 is an explanatory view for explaining an etching process in a substrate processing process of a comparative example.

FIG. 12 shows an etched portion 508 of a modified film of a deposited film 502 on a substrate 500 in the comparative example. As shown in FIG. 12, in the etched portion 508 of the modified film on the substrate 500, since the etching is in the middle of proceeding in a vertical direction, the etching hardly spreads in a horizontal direction.

Figure 13:
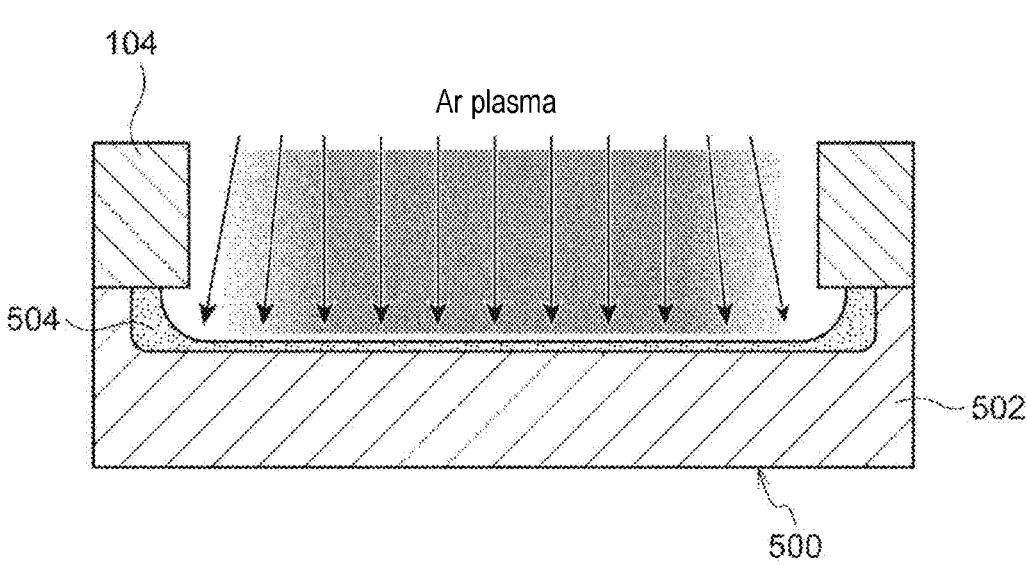
FIG. 13 is an explanatory view for explaining a state of a modified film by the etching process in the substrate processing process of the comparative example.

Therefore, as shown in FIG. 13, in the comparative example, anisotropic etching due to the plasma directivity of the removal gas (for example, Ar plasma) occurs. That is, when a modified film 504 is removed, the plasma directivity of the removal gas influences the etching to reduce the removal of the modified film 504 on a lower side wall surface of a pattern 104 (anisotropic etching).

In contrast, as shown in FIG. 5, in the graph 130 of the present technical example, when only the plasma-activated removal gas is supplied, the etching amount increases with the processing time, but by adding the protective-film-forming gas, the etching amount hardly increases even if the processing time is long.

FIG. 6 shows an etched portion 112 of the modified film of the deposited film 102 on the substrate 100 in the example of the present technique. As shown in FIG. 6, in the example of the present technique, by adding the protective-film-forming gas, since the etching is saturated in the vertical direction, the etched portion 112 of the modified film on the substrate 100 proceed with over-etching in the horizontal direction. This proceeding is considered to be due to the following reasons. The protective-film-forming gas supplied together with the removal gas is decomposed and adsorbed on the modified film of the deposited film 102 on the substrate 100 to form a protective film on the modified film. The protective film is formed to be thicker in the vertical direction than in the horizontal direction. The formed protective film reduces the rate of etching in the vertical direction by the removal gas. Therefore, the saturated state of etching is generated in a pseudo manner. As a result, the etching that is saturated in the vertical direction is considered to proceed in the horizontal direction which is in an unsaturated state. In this way, the etching rate is reduced in the vertical direction and the etching in the horizontal direction is promoted, so that isotropic etching can be realized.

Figure 7:
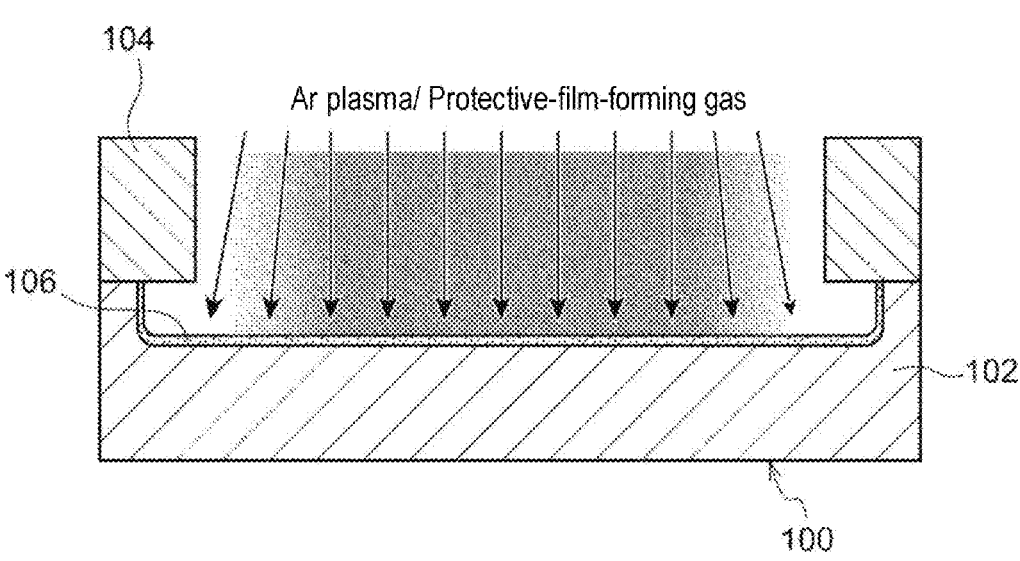
FIG. 7 is an explanatory view for explaining a state of a modified film by the etching process in the substrate processing process according to the first embodiment of the present disclosure.

Therefore, as shown in FIG. 7, in the example of the present technique, the side etching of the modified film 106 of the deposited film 102 on the substrate 100 proceeds, so that isotropic etching can be realized.

(Substrate Unloading Step)

After the modified film 106 on the substrate 100 is removed by the substrate processing process, the substrate mounting table 212 shown in FIG. 1 is lowered to move the substrate 100 to the transfer position. After moving to the transfer position, the substrate 100 is unloaded from the transfer space 206.

(Operation and Effects)

Next, the operation and effects of the first embodiment will be described.

The method of manufacturing the semiconductor device according to the first embodiment includes the modifying step of supplying the modifying gas to modify the deposited film 102_not masked by the pattern 104 on the substrate 100 to form the modified film 106. Further, the method of manufacturing the semiconductor device according to the first embodiment includes the modified-film-removing step of removing the modified film 106 on the substrate 100, including the timing of supplying the plasma-activated removal gas and the protective-film-forming gas at least at the same time.

In the modifying step, for example, by supplying the modifying gas in the plasma state, the deposited film 102 not masked by the pattern 104 on the substrate 100 is modified to form the modified film 106. As a result, the modified film 106 is formed on the surface side of the deposited film 102.

The modified-film-removing step includes the timing of supplying the plasma-activated removal gas and the protective-film-forming gas at least at the same time. In the method of manufacturing the semiconductor device according to the first embodiment, the plasma-activated removal gas and the protective-film-forming gas are supplied at the same time, whereby the modified film 106 on the substrate 100 is removed.

For example, as shown in FIG. 12, in the comparative example in which only the plasma-activated removal gas is supplied, since the etching is in the middle of proceeding in the vertical direction, the etching of the etched portion 508 of the modified film on the substrate 500 hardly spreads in the horizontal direction. Therefore, as shown in FIG. 13, when the modified film 504 is removed, the plasma directivity by the removal gas influences the etching to reduce the removal of the modified film 504 on the lower side wall surface of the pattern 104 (anisotropic etching).

In contrast, in the method of manufacturing the semiconductor device according to the first embodiment, the plasma-activated removal gas and the protective-film-forming gas are supplied at the same time in the modified-film-removing step. As a result, as shown in FIG. 6, by adding the protective-film-forming gas, the protective-film-forming gas is adsorbed on the modified film of the deposited film 102 on the substrate 100 to form the protective film, so that the saturated state of etching is generated in a pseudo manner. As a result, as shown in FIG. 7, the side etching of the modified film 106 of the deposited film 102 on the substrate 100 proceeds.

Therefore, in the method of manufacturing the semiconductor device according to the first embodiment, the influence of the plasma directivity can be reduced and the isotropic etching can be realized.

Further, in the method of manufacturing the semiconductor device according to the first embodiment, the supply of the protective-film-forming gas is started at the same time when the supply of the removal gas is started (see FIG. 4). This facilitates control of a timing at which the protective-film-forming gas is supplied, thereby improving the controllability of process.

Further, in the method of manufacturing the semiconductor device according to the first embodiment, the supply of the protective-film-forming gas is stopped at the same time when the supply of the removal gas is stopped (see FIG. 4). This facilitates control of a timing at which the supply of the protective-film-forming gas is stopped, thereby improving the controllability of process.

Further, the method of manufacturing the semiconductor device according to the first embodiment includes the repeating step in which the modifying step and the modified-film-removing step are regarded as one cycle, and the one cycle is repeated a predetermined number of times. In the first embodiment, the one cycle is repeated once in the repeating step. For example, in one modified-film-removing step, even if the supply amount of the removal gas is increased or the processing time is lengthened, it is difficult to increase the etching amount. This is because the modifying step is a saturated reaction. In contrast, by providing the repeating step of repeating the one cycle a predetermined number of times, a desired etching amount can be secured.

Further, the substrate processing apparatus 200 includes the processing space 205 constituting the process chamber that processes the substrate 100, the first gas supply system 243 that supplies the modifying gas to the processing space 205, the second gas supply system 247 that supplies the plasma-activated removal gas to the processing space 205, and the third gas supply system 249 that supplies the protective-film-forming gas to the processing space 205. Further, the substrate processing apparatus 200 includes the controller 280 that performs a process of supplying the modifying gas from the first gas supply system 243 to modify the deposited film 102 not masked by the pattern 104 on the substrate 100 to form the modified film 106 and a process of removing the modified film 106 on the substrate 100, including the timing of supplying the removal gas from the second gas supply system 247 and the protective-film-forming gas from the third gas supply system 249 at least at the same time.

Therefore, in the substrate processing apparatus 200, the influence of the plasma directivity can be reduced and the isotropic etching can be realized.

Further, the program of the substrate processing apparatus 200 causes, by a computer, the substrate processing apparatus 200 to perform a step of supplying the modifying gas to modify the deposited film 102 not masked by the pattern 104 on the substrate 100 to form the modified film 106 and a step of removing the modified film 106 on the substrate 100, including the timing of supplying the plasma-activated removal gas and the protective-film-forming gas at least at the same time.

Therefore, in the program according to the first embodiment, the influence of the plasma directivity can be reduced and the isotropic etching can be realized.

Second Embodiment of the Present Disclosure

Next, a substrate processing apparatus and a method of manufacturing a semiconductor device according to a second embodiment of the present disclosure will be described. The same components as those of the first embodiment described above will be noted by the same reference numerals, and explanation thereof will not be repeated.

Figure 8:
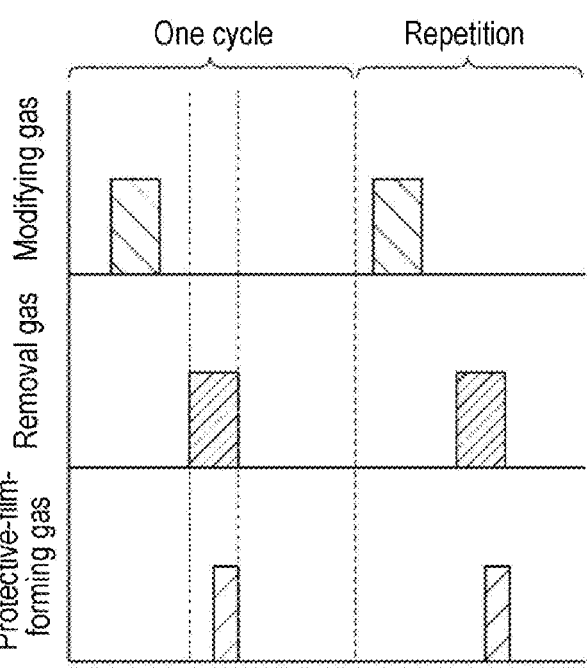
FIG. 8 is a flow chart for explaining a substrate processing process according to a second embodiment of the present disclosure.

In the second embodiment, the same substrate processing apparatus 200 as in the first embodiment is used. In the second embodiment, a portion of the substrate processing process in the method of manufacturing the semiconductor device according to the first embodiment is changed. FIG. 8 is a flow chart for explaining a substrate processing process in the method of manufacturing the semiconductor device according to the second embodiment.

As shown in FIG. 8, in the modifying step, the modifying gas is supplied to the processing space 205 (see FIG. 1) in which the substrate 100 is arranged. As a result, a portion of the deposited film 102 on the substrate 100 is modified by the modifying gas and the modified film 106 is formed on the surface side of the deposited film 102 (see FIG. 3B). The modifying step is the same as the modifying step of the first embodiment.

As shown in FIG. 8, in the modified-film-removing step, the plasma-activated removal gas is supplied to the processing space 205 (see FIG. 1) in which the substrate 100 is arranged. Further, after the supply of the plasma-activated removal gas, the supply of the protective-film-forming gas is started. When the removal gas and the protective-film-forming gas are supplied at the same time, the etching rate decreases because the protective film formation and removal proceed at the same time. On the other hand, in the second embodiment, the decrease in etching rate is suppressed. Further, the supply of the protective-film-forming gas is stopped at the same time when the supply of the plasma-activated removal gas is stopped. That is, the modified-film-removing step of the second embodiment also includes the timing of supplying the plasma-activated removal gas and the protective-film-forming gas at least at the same time. By such a modified-film-removing step, the modified film 106 on the substrate 100 is removed (see FIG. 3C). In the modified-film-removing step, the supply of the protective-film-forming gas generates the saturated state of etching in a pseudo manner and the side etching of the modified film 106 on the substrate 100 proceeds.

As shown in FIG. 8, in the repeating step, the modifying step and the modified-film-removing step are regarded as one cycle, and the one cycle is repeated a predetermined number of times. In the second embodiment, the one cycle is repeated once in the repeating step. As a result, a desired film thickness of the deposited film 102 on the substrate 100 is removed.

The method of manufacturing the semiconductor device according to the second embodiment has the following operation and effects in addition to the operation and effects of the same steps as the method of manufacturing the semiconductor device according to the first embodiment.

In the method of manufacturing the semiconductor device according to the second embodiment, the supply of the protective-film-forming gas is started after the supply of the plasma-activated removal gas is started. As a result, as shown in FIG. 8, there is a timing at which the protective-film-forming gas that hinders the etching in the vertical direction is not supplied before the modified-film-removing step. Therefore, the decrease in the etching rate when the modified film 106 on the substrate 100 is etched is small.

Third Embodiment of the Present Disclosure

Next, a substrate processing apparatus and a method of manufacturing a semiconductor device according to a third embodiment of the present disclosure will be described. The same components as those of the first and second embodiments described above will be denoted by the same reference numerals, and explanation thereof will not be repeated.

Figure 9:
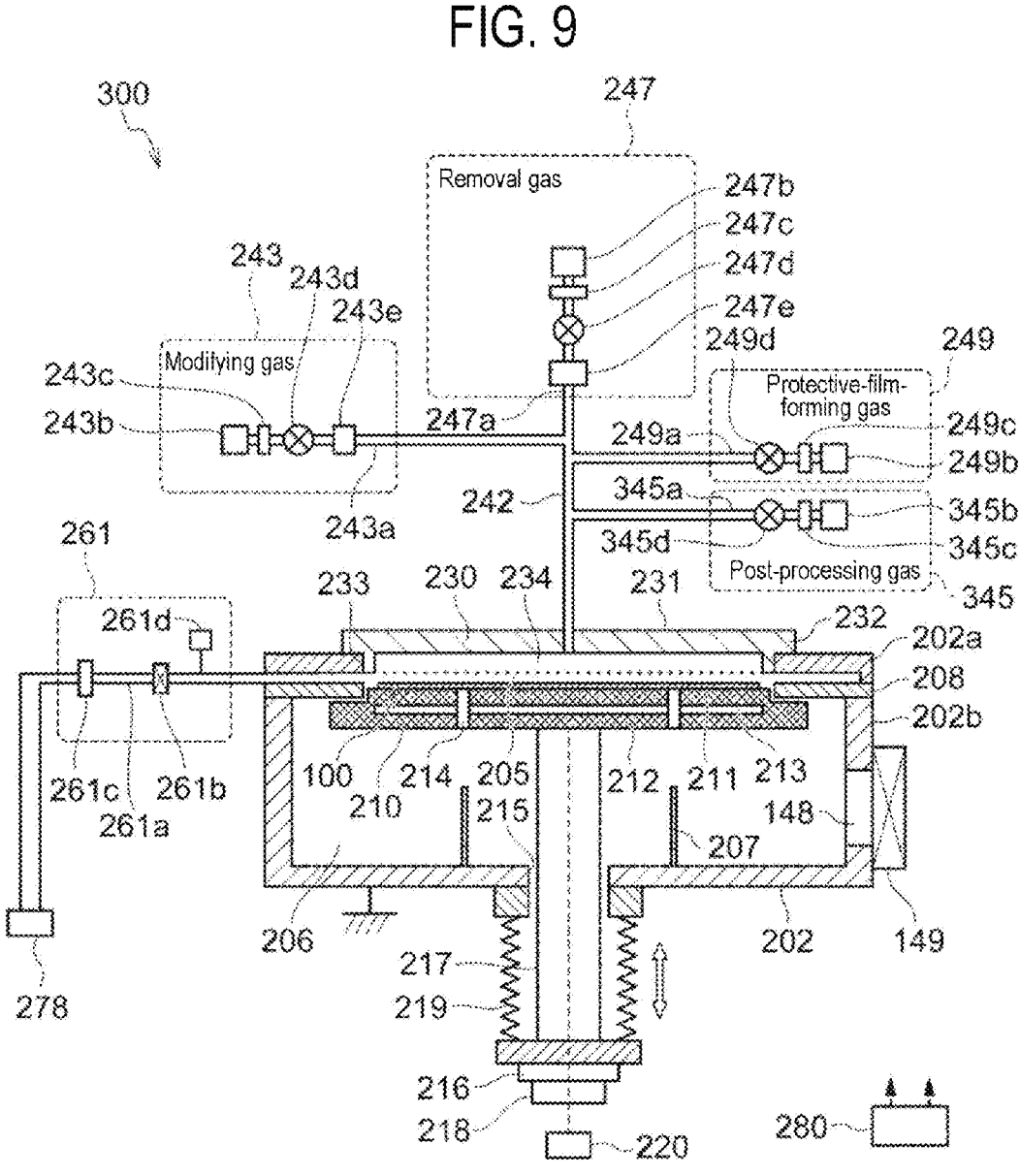
FIG. 9 is an explanatory view showing a schematic configuration example of a substrate processing apparatus according to a third embodiment of the present disclosure.

FIG. 9 shows a substrate processing apparatus 300 according to the third embodiment. As shown in FIG. 9, the substrate processing apparatus 300 includes a fourth gas supply pipe 345a connected to the common gas supply pipe 242. A fourth gas is mainly supplied from a fourth gas supply system 345 including the fourth gas supply pipe 345a.

(Fourth Gas Supply System)

The fourth gas supply pipe 345a is provided with a fourth gas supply source 345b, a mass flow controller (MFC) 345c, which is a flow rate controller (flow rate control part), and a valve 345d, which is an opening/closing valve, sequentially from an upstream side.

The fourth gas is supplied from the fourth gas supply pipe 345a into the shower head 230 via the mass flow controller 345c, the valve 345d, and the common gas supply pipe 242.

In the third embodiment, the fourth gas is a post-processing gas. The post-processing gas removes a protective film formed by adsorbing the protective-film-forming gas (for example, $C_3H_6$) on the surface of the modified film 106 on the substrate 100. As the post-processing gas, for example, oxygen ($O_2$), NO, $N_2O$ or the like is supplied from the fourth gas supply system 345. For example, by using oxygen ($O_2$) as the post-processing gas, the protective film can be released as $CO_2$.

The fourth gas supply system 345 mainly includes the fourth gas supply pipe 345a, the fourth gas supply source 345b, the mass flow controller 345c, and the valve 345d. The fourth gas supply system 345 is an example of a post-processing gas supplier that supplies the post-processing gas.

The substrate processing apparatus 300 according to the third embodiment is configured to supply the post-processing gas from the fourth gas supply system 345 after the modified-film-removing step.

Figure 10:
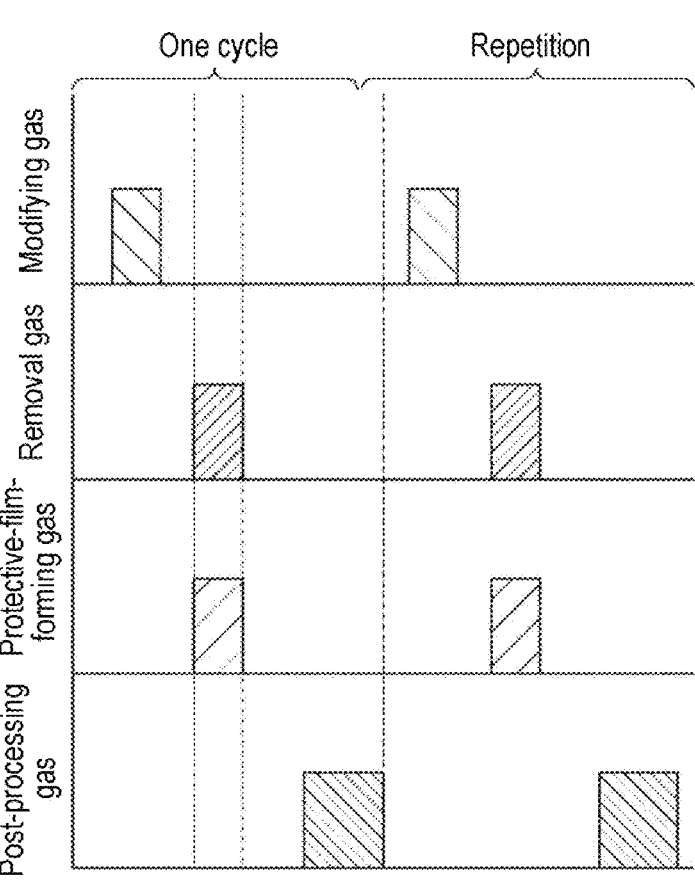
FIG. 10 is a flow chart for explaining a substrate processing process according to the third embodiment of the present disclosure.

FIG. 10 is a flow chart for explaining a substrate processing process in the method of manufacturing the semiconductor device according to the third embodiment. As shown in FIG. 10, similarly to the substrate processing process of the first embodiment, the substrate processing process includes a modifying step of supplying the modifying gas and a modified-film-removing step of supplying the plasma-activated removal gas and the protective-film-forming gas at the same time. Further, the substrate processing process includes, as a step different from the substrate processing process of the first embodiment, a protective-film-removing step of supplying a post-processing gas after the modified-film-removing step to remove the protective film on the surface of the modified film 106 on the substrate 100.

Further, as shown in FIG. 10, the substrate processing process includes a repeating step in which the modifying step, the modified-film-removing step, and the protective-film-removing step are regarded as one cycle, and the one cycle is repeated a predetermined number of times. In the third embodiment, the one cycle is repeated once.

The method of manufacturing the semiconductor device according to the third embodiment has the following operation and effects in addition to the operation and effects of the same steps as the method of manufacturing the semiconductor device according to the first embodiment.

The method of manufacturing the semiconductor device according to the third embodiment includes the protective-film-removing step of supplying the post-processing gas after the modified-film-removing step to remove the protective film on the surface of the modified film 106 on the substrate 100. For example, if the protective film remains, it hinders the modification of the deposited film on the substrate in a modifying step of the next cycle. For example, if the protective film remains, since a modifying gas is supplied from above the protective film, the modifying state becomes sparse. Then, a newly formed protective film becomes sparse, and as a result, the etching state becomes sparse. In contrast, in the method of manufacturing the semiconductor device according to the third embodiment, by removing the protective film on the surface of the modified film 106 on the substrate 100, the influence of the deposited film 102 on the substrate 100 to the modification by supplying the modifying gas in the next cycle is suppressed. Therefore, the protective film to be formed next can be uniformly formed.

Further, the method of manufacturing the semiconductor device according to the third embodiment includes the repeating step in which the modifying step, the modifiedfilm-removing step, and the protective-film-removing step are regarded as one cycle, and the one cycle is repeated a predetermined number of times. Therefore, in the method of manufacturing the semiconductor device according to the third embodiment, the influence of the deposited film 102 on the substrate 100 to the modification by supplying the modifying gas in the next cycle is reduced, and the etching amount of the modified film 106 on the substrate 100 can be secured.

Fourth Embodiment of the Present Disclosure

Next, a substrate processing apparatus and a method of manufacturing a semiconductor device according to a fourth embodiment of the present disclosure will be described. The same components as those of the first to third embodiments described above will be denoted by the same reference numerals, and explanation thereof will not be repeated.

Figure 11:
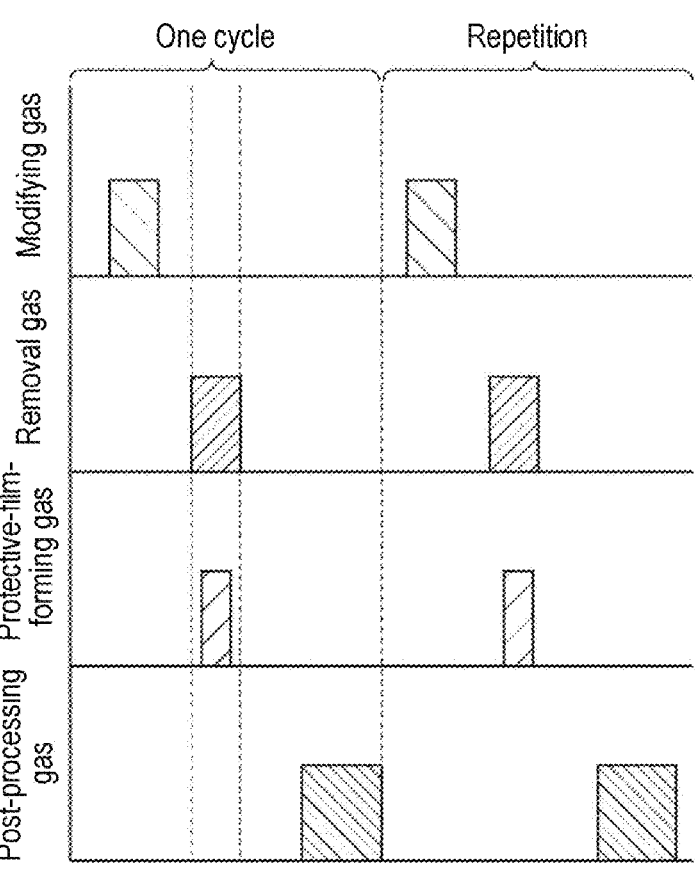
FIG. 11 is a flow chart for explaining a substrate processing process according to a fourth embodiment of the present disclosure.

In the fourth embodiment, the same substrate processing apparatus 300 as in the third embodiment is used. In the fourth embodiment, a portion of the substrate processing process in the method of manufacturing the semiconductor device according to the third embodiment is changed. FIG. 11 is a flow chart for explaining a substrate processing process in the method of manufacturing the semiconductor device according to the fourth embodiment.

As shown in FIG. 11, in the substrate processing process, the timing of supplying the protective-film-forming gas in the modified-film-removing step in the substrate processing process of the third embodiment is changed. The supply of the protective-film-forming gas is started after the supply of the plasma-activated removal gas is started. Further, the protective-film-forming gas is stopped before the supply of the plasma-activated removal gas is stopped.

Further, as shown in FIG. 11, the substrate processing process includes a repeating step in which the modifying step, the modified-film-removing step, and the protective-film-removing step are regarded as one cycle, and the one cycle is repeated a predetermined number of times. In the fourth embodiment, the one cycle is repeated once in the repeating step.

The method of manufacturing the semiconductor device according to the fourth embodiment has the following operation and effects in addition to the operation and effects by the same steps as the method of manufacturing the semiconductor device according to the third embodiment.

In the method of manufacturing the semiconductor device according to the fourth embodiment, in the modified-film-removing step, the supply of the protective-film-forming gas is started after the supply of the plasma-activated removal gas is started. As a result, as shown in FIG. 11, there is a timing at which the protective-film-forming gas that hinders etching in the vertical direction is not supplied in the beginning of the modified-film-removing step. Therefore, the decrease in the etching rate when the modified film 106 on the substrate 100 is etched is small, so that the increase in the process time is suppressed.

Further, in the method of manufacturing the semiconductor device according to the fourth embodiment, the supply of the protective-film-forming gas is stopped before the supply of the plasma-activated removal gas is stopped. As a result, as shown in FIG. 11, there is a timing at which the protective-film-forming gas that hinders etching in the vertical direction is not supplied at the end of the modified-film-removing step. Therefore, the decrease in the etching rate when the modified film 106 on the substrate 100 is etched is small, so that the increase in the process time is suppressed.

Others

Although the embodiments of the present disclosure have been specifically described above, the present disclosure is not limited to each of the above-described embodiments, and various changes can be made without departing from the gist thereof.

In the first to fourth embodiments, in the modified-film-removing step, the timing at which the supply of the protective-film-forming gas is started with respect to the supply of the plasma-activated removal gas can be changed. Further, in the first to fourth embodiments, in the modified-film-removing step, the timing at which the supply of the plasma-activated removal gas and the protective-film-forming gas is stopped can be changed. In the technique of the present disclosure, in the modified-film-removing step, it is sufficient to include the timing of supplying the plasma-activated removal gas and the protective-film-forming gas at least at the same time. For example, the supply of the protective-film-forming gas may starts at the same time when the supply of the plasma-activated removal gas is started, or the supply of the protective-film-forming gas may starts after the supply of the plasma-activated removal gas is started. Further, for example, the supply of the protective-film-forming gas may stops at the same time when the supply of the plasma-activated removal gas is stopped, or the supply of the plasma-activated removal gas may stops after the supply of the protective-film-forming gas is stopped.

Further, in the first to fourth embodiments, in the modified-film-removing step, the supply of the protective-film-forming gas may be divided into a plurality of times while the plasma-activated removal gas is being supplied. As a result, the decrease in the etching rate is reduced, thereby improving the controllability of process over a case where the protective-film-forming gas is supplied once.

Further, in the first to fourth embodiments, one cycle is repeated once in the repeating step, but the technique of the present disclosure is not limited to this configuration, and the one cycle may be repeated a plurality of times in the repeating step.

According to the present disclosure in some embodiments, it is possible to provide a technique capable of realizing isotropic etching while reducing the influence of plasma directivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate processing method, comprising:
   forming a modified film by supplying a modifying gas to modify an unmasked deposited film on a substrate; and
   removing the modified film while forming a protective film on the modified film by supplying a removal gas activated by plasma and supplying a protective-film-forming gas, wherein the act of removing the modified film includes supplying the plasma-activated removal gas and the protective-film-forming gas simultaneously, and the protective-film-forming gas is decomposed and adsorbed on the modified film to form the protective film on the modified film.

2. The method of claim 1, wherein the act of forming the modified film and the act of removing the modified film are set as one cycle, and wherein the method further comprises:

repeating the one cycle a predetermined number of times.

3. The method of claim 1, further comprising: repeating the act of forming the modified film and the act of removing the modified film a predetermined number of times.

4. The method of claim 1, further comprising: repeating the act of removing the modified film a predetermined number of times.

5. The method of claim 1, wherein the act of supplying the protective-film-forming gas is performed a predetermined number of times during the act of supplying the removal gas.

6. The method of claim 1, wherein the supply of the protective-film-forming gas is started after the supply of the removal gas is started.

7. The method of claim 1, wherein the supply of the protective-film-forming gas is started at the same time when the supply of the removal gas is started.

8. The method of claim 1, wherein the supply of the protective-film-forming gas is stopped before the supply of the removal gas is stopped.

9. The method of claim 1, wherein the supply of the protective-film-forming gas is stopped at the same time when the supply of the removal gas is stopped.

10. The method of claim 1, further comprising: removing the protective film on the modified film by supplying a post-processing gas after the act of removing the modified film.

11. The method of claim 10, wherein the act of forming the modified film and the act of removing the protective film are set as one cycle, and wherein the method further comprises:

repeating the one cycle a predetermined number of times.

12. A method of manufacturing a semiconductor device comprising the method of claim 1.

13. The method of claim 1, wherein the protective-film-forming gas forms the protective film to be thicker in a vertical direction than in a horizontal direction, on the modified film.

14. The method of claim 1, wherein the protective film is formed to be thicker in a vertical direction than in a horizontal direction, on the modified film, so that the modified film is removed by the plasma-activated removal gas in a vertical direction in a saturated state and in a horizontal direction in an unsaturated state.

15. The method of claim 14, wherein a pattern is formed to mask a portion of the deposited film, and wherein when the modified film is removed in the horizontal direction, a region below the pattern is removed.

16. A non-transitory computer-readable recording medium storing a program that causes, by a computer, a substrate processing apparatus to perform a process comprising:

forming a modified film by supplying a modifying gas to modify an unmasked deposited film on a substrate; and removing the modified film while forming a protective film on the modified film by supplying a removal gas activated by plasma and supplying a protective-film-forming gas, wherein the act of removing the modified film includes supplying the plasma-activated removal gas and the protective-film-forming gas simultaneously, and the protective-film-forming gas is decomposed and adsorbed on the modified film to form the protective film on the modified film.

* * * * *